United States Patent
Eun et al.

(10) Patent No.: US 7,652,323 B2
(45) Date of Patent: Jan. 26, 2010

(54) SEMICONDUCTOR DEVICE HAVING STEP GATES AND METHOD OF MANUFACTURING THE SAME

(75) Inventors: Byung Soo Eun, Seoul (KR); Jung Suk Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 484 days.

(21) Appl. No.: 11/293,317

(22) Filed: Dec. 1, 2005

(65) Prior Publication Data
US 2006/0220111 A1    Oct. 5, 2006

(30) Foreign Application Priority Data
Apr. 4, 2005    (KR) ............... 10-2005-0028298

(51) Int. Cl.
*H01L 21/70* (2006.01)
(52) U.S. Cl. ............ 257/318; 257/315; 257/E21.69; 257/E27.103; 438/258; 438/524
(58) Field of Classification Search .......... 257/E21.624, 257/E21.621, 315, 318, E21.69, E27.103
See application file for complete search history.

(56) References Cited
U.S. PATENT DOCUMENTS 5,945,705 A * 8/1999 Liu et al. ................. 257/315
6,320,218 B1 * 11/2001 Furuhata ................. 257/318
2002/0142551 A1  10/2002 Park et al.
2005/0151274 A1   7/2005 Song

FOREIGN PATENT DOCUMENTS

| KR | 1020050047659 A | 5/2005 |
| KR | 1020050063897 A | 6/2005 |

* cited by examiner

*Primary Examiner*—Zandra Smith
*Assistant Examiner*—Tsz K Chiu
(74) *Attorney, Agent, or Firm*—Townsend and Townsend and Crew LLP

(57) ABSTRACT

A semiconductor device having step gates includes a semiconductor substrate including first regions having relatively low steps at both ends of an active region defined by trench isolation films and a second region having a relatively high step at a central part of the active region, a groove having a predetermined depth being formed at the central part of the second region, step gate stacks formed on the boundary between the first region and second region while exposing the groove of the second region, first impurity regions formed in the first regions exposed by the step gate stacks, and a second impurity region formed in the second region exposed by the step gate stacks while enclosing the groove of the second region.

4 Claims, 6 Drawing Sheets

SEMICONDUCTOR DEVICE HAVING STEP GATES AND METHOD OF MANUFACTURING THE SAME

BACKGROUND OF THE INVENTION

The present invention relates to a semiconductor device and a method of manufacturing the same. More particularly, the present invention relates to a semiconductor device having step gates to improve overall signal transfer rate, and a method of manufacturing the same.

In conventional dynamic random access memories (DRAMs), a gate stack is provided on a semiconductor substrate having a trench isolation film, and a source/drain junction region is provided on the semiconductor substrate at both sides of the gate stack. A gate having such a structure is called a planar gate. The planar gate has a short channel length between the source and drain, and therefore exhibits fast operating speed due to the low resistance of the channel.

However, the increased degree of integration of DRAM cells leads to a decrease in the size of the transistors, which in turn results in a shortened channel length between the source and drain. As a result, short-channel effects (SCF) of the transistors become severe, thus decreasing the threshold voltage. In order to prevent a decrease of threshold voltage due to short-channel effects of the transistors, the channel doping concentration has conventionally been increased in order to obtain desired magnitude of threshold voltage.

However, such increased channel doping concentration leads to localized electricfield enhancement effects in source junctions and increased leakage current, thereby aggravating the refresh properties of DRAM memory cells. Therefore, recess channel structures, which are capable of inhibiting the above-mentioned issues without decreasing the degree of integration of the device via the lengthening of the effective channel by etching a portion of a substrate to a given depth, are being actively researched. Among such recess channel structures, step gate stack structures, in which the lower part of the gate is formed into a step shape, thereby being capable of lengthening the channel, are receiving a great deal of attention in the art.

FIG. 1 is a cross-sectional view showing a step gate structure of a semiconductor device having a recess channel in accordance with a conventional art.

As shown in FIG. 1, trench isolation films 110 defining an active region are provided in a semiconductor substrate 100. The trench isolation films 110 are made of insulating films, for example oxide films. Step gate stacks 120 are provided on the semiconductor substrate 100, and the step gate stacks 120 take step-like profiles having upper/lower and vertical surfaces on lower parts thereof. Source regions such as first impurity regions 130 and a drain region as a second impurity region 135 are provided on the semiconductor substrate 100 at both sides of the step gate stacks 120. A gate insulating film 101 is deposited at the lower part of the step gate stacks 120. In addition, even though they are not shown in FIG. 1, bottom electrode films, which are electrically connected to the first impurity regions 130 provided in the semiconductor substrate 100, capacitors (not shown) including a dielectric film and top electrode film sequentially formed on the bottom electrode films, and a bit line stack (not shown) connected to the second impurity region 135 are formed on the substrate.

As described above, since the step gate of the semiconductor device has a long channel length due to the step-like profiles having upper/lower and vertical surfaces, it is possible to prevent the localized electric-field enhancement effects in source junctions without increasing the channel doping concentration, thus decreasing leakage current. However, prolonged channel length results in increased resistance of the device which in turn decreases the signal transfer rate of the overall DRAM.

BRIEF SUMMARY OF THE INVENTION

Embodiments of the present invention to provide a semiconductor device having step gates in order to improve the overall signal transfer rate thereof, and a method of manufacturing the same.

In accordance with an aspect of the present invention, a semiconductor device having step gates includes a semiconductor substrate including first regions having relatively low steps at both ends of an active region defined by trench isolation films, a second region having a relatively high step at the central part of the active region, and a groove having a predetermined depth being formed at the central part of the second region; step gate stacks provided on the boundary between the first region and second region while exposing the groove of the second region; first impurity regions provided in the first regions exposed by the step gate stacks; and a second impurity region provided in the second region exposed by the step gate stacks while enclosing the groove of the second region.

The groove formed at the central part of the second region of the semiconductor substrate may be provided to have a depth shallower than that of the second impurity region. The second region of the semiconductor substrate is a film formed via selective epitaxial growth.

The semiconductor device in accordance with the present invention may further include bottom electrode films electrically connected to the first impurity regions, capacitors including a dielectric film and top electrode film sequentially formed on the bottom electrode films, and a bit line stack connected to the second impurity region.

In accordance with another aspect of the present invention, a method of manufacturing a semiconductor device having step gates is provided. The method comprises forming trench isolation films on a semiconductor substrate, using hard mask film patterns covering an active region thereof; removing a portion of the hard mask film patterns to expose a first surface and second surface of the active region, while allowing the first and second surfaces to be separated by the hard mask film patterns formed at the central part of the active region; forming selective epitaxial growth layers on the first and second surfaces of the active region; removing the hard mask film patterns; forming step gate stacks on the boundary between the semiconductor substrate of the active region and selective epitaxial growth layer; and forming first impurity regions and a second impurity region in the semiconductor substrate using the step gate stacks as an ion implantation mask. The selective epitaxial layer may be grown using dichlorosilane, hydrochloric acid and hydrogen as source gases.

The method of the present invention may further include cleaning the exposed first and second surfaces of the active region after exposure. The cleaning process can be carried out using a first cleaning solution comprising sulfuric acid and hydrogen peroxide and/or a second cleaning solution comprising hydrofluoric acid and ammonium fluoride. The first cleaning solution may be a 4:1 mixture of sulfuric acid and hydrogen peroxide. The second cleaning solution may be a 300:1 mixture of hydrofluoric acid and ammonium fluoride.

The method of the present invention may further include forming bottom electrode films electrically connected to the first impurity regions, and capacitors including a dielectric film and top electrode film sequentially formed on the bottom electrode films; and forming a bit line stack connected to the second impurity region.

BRIEF DESCRIPTION OF THE DRAWINGS

The present invention will be more clearly understood from the following detailed description taken in conjunction with the accompanying drawings, in which.

DETAILED DESCRIPTION OF THE INVENTION

Figure 1:
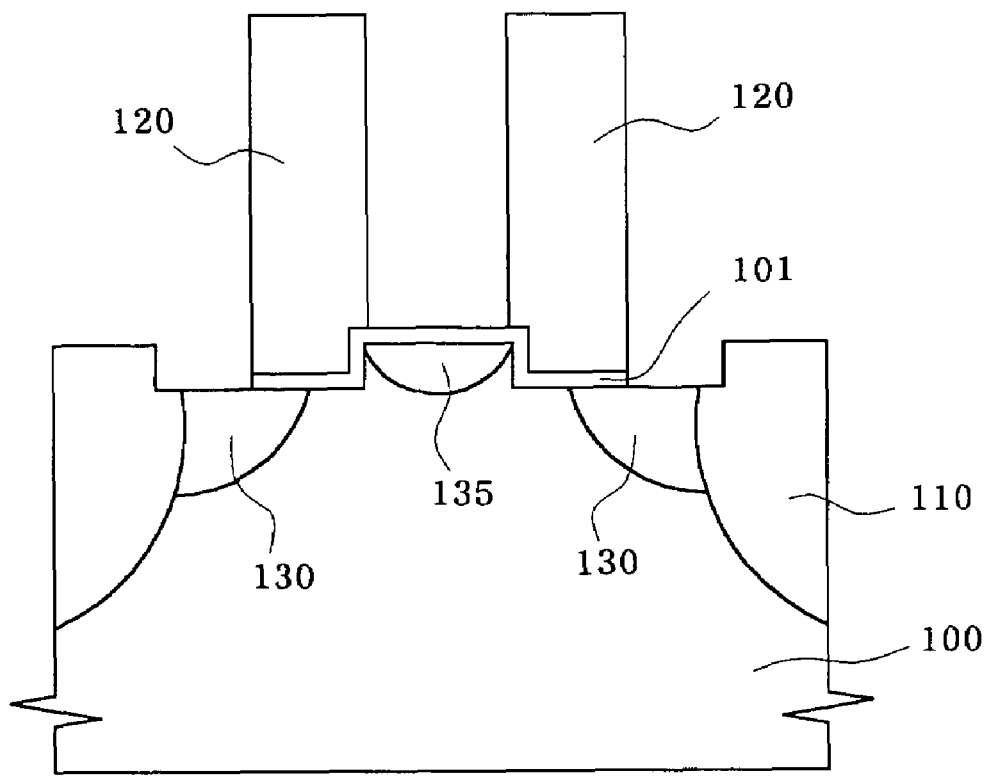
FIG. 1 is a view illustrating a semiconductor device having step gates in accordance with a conventional art and a method of manufacturing the same.

Now, preferred embodiments of the present invention will be described in more detail with reference to accompanying drawings, such that those skilled in the art can easily practice the present invention. In the drawings, thicknesses of various layers and regions are exaggerated for clarity. Like numbers refer to like elements throughout the specification and drawings.

Figure 8:
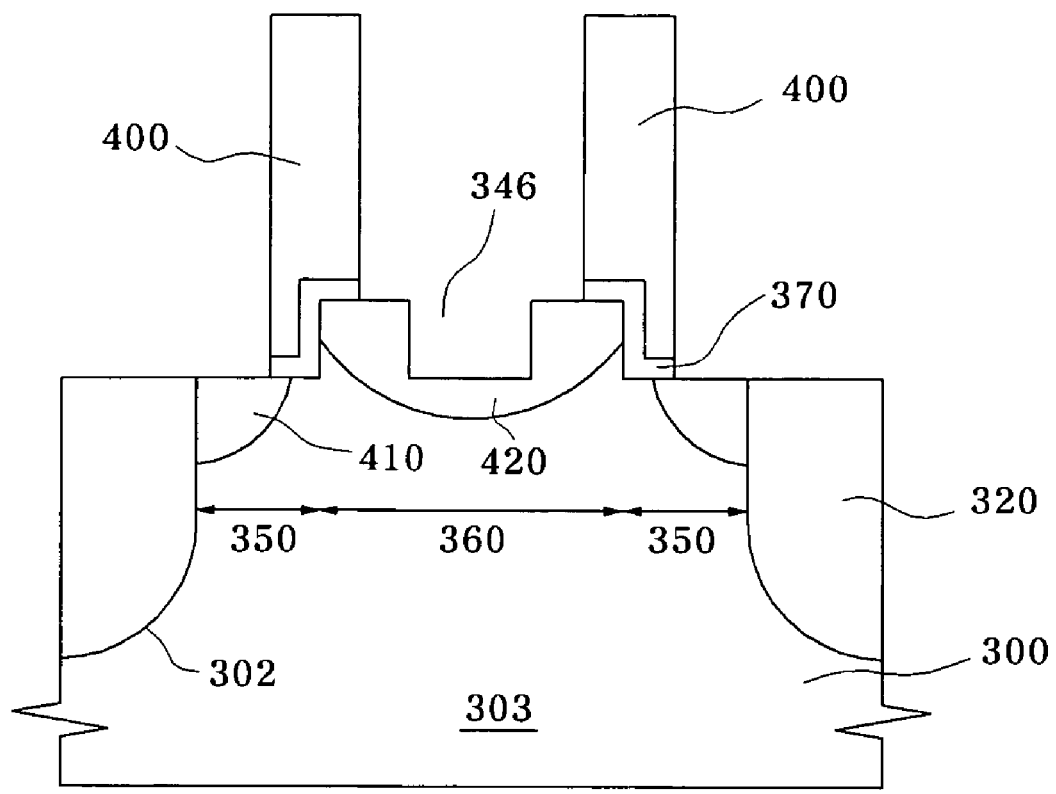
Figure 9:
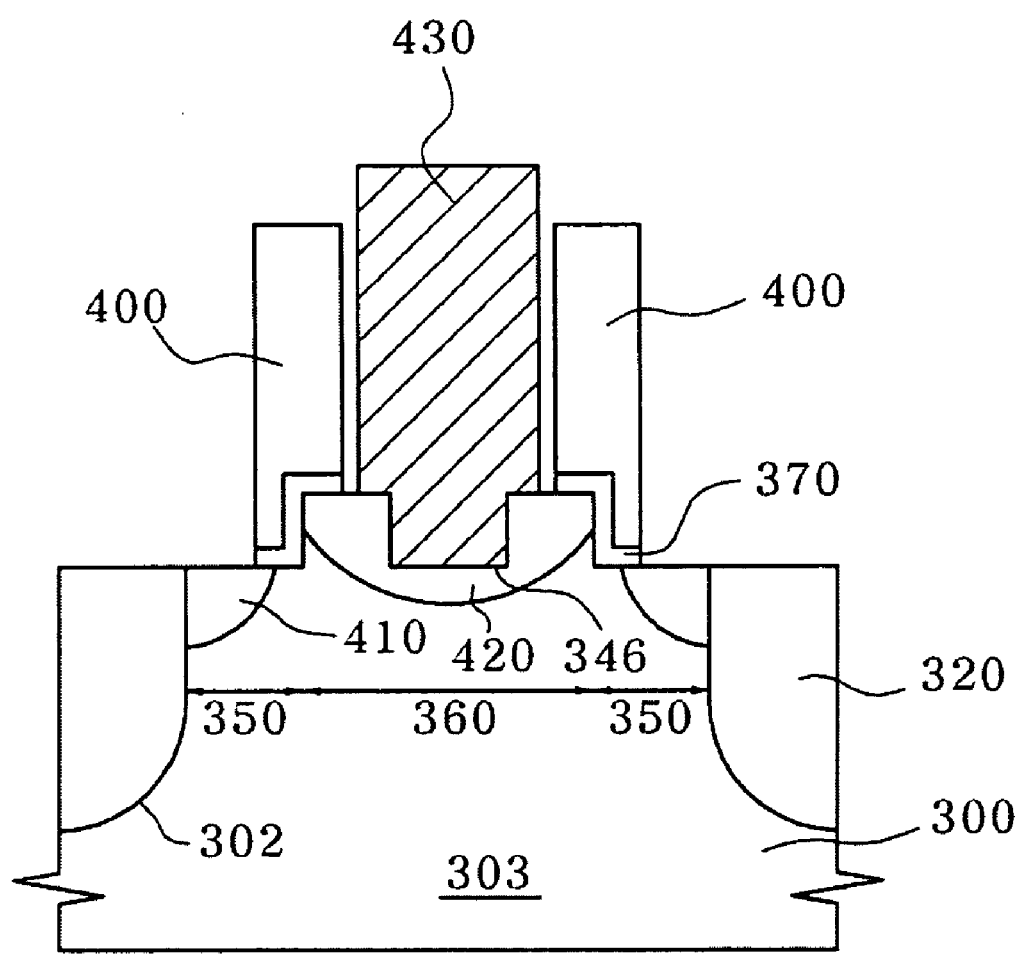

FIG. 8 and FIG. 9 are views illustrating a semiconductor device having step gates in accordance with one embodiment of the present invention.

Referring now to FIG. 8 and FIG. 9, a semiconductor device having step gates in accordance with the present invention includes first regions 350 having relatively low steps at both ends of an active region defined by trench isolation films 320 and a second region 360 having a groove 346 having a predetermined depth formed at a central part of the active region. Step gate stacks 400 are formed on the boundary between the first region 350 and second region 360. The step gate stacks 400 are formed so as to expose the groove 346 formed at the central part of the second region 360. First impurity regions 410, as source regions, are formed in the first regions 350 exposed by the step gate stacks 400, and a second impurity region 420, as a drain region, is formed in the second region 360. The second impurity region 420 is formed so as to enclose the groove 346 formed at the central part of the second region 360. In this case, gate insulating films 301 are formed on the lower parts of the step gate stacks 400, and even though they are not shown in FIG. 8, bottom electrode films, which are electrically connected to the first impurity regions 410 formed in the semiconductor substrate 300, capacitors (not shown) including a dielectric film and top electrode film sequentially formed on the bottom electrode films, and a bit line 430 connected to the second impurity region 420 are formed.

In such a structure, a contact area between the second impurity region 420 formed in the second region 360 and lower surface of the bit line 430 connected to the second impurity region 420 becomes larger due to the presence of the groove 346 formed at the central part of the second region 360, thereby being capable of lowering the contact resistance therebetween.

Figure 2:
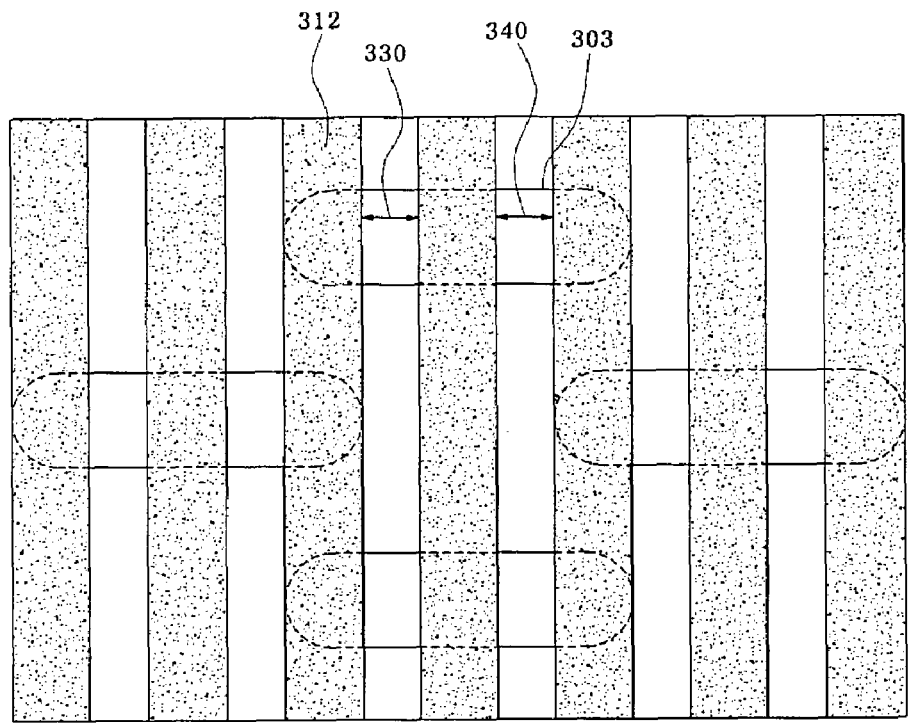
FIG. 2 is a layout view illustrating a semiconductor device having step gates in accordance with one embodiment of the present invention and a method of manufacturing the same.

FIG. 2 is a layout view illustrating a method of manufacturing a semiconductor device having step gates in accordance with one embodiment of the present invention. FIGS. 3 through 8 are views illustrating a semiconductor device having step gates in accordance with one embodiment of the present invention and a method of manufacturing the same.

Figure 3:
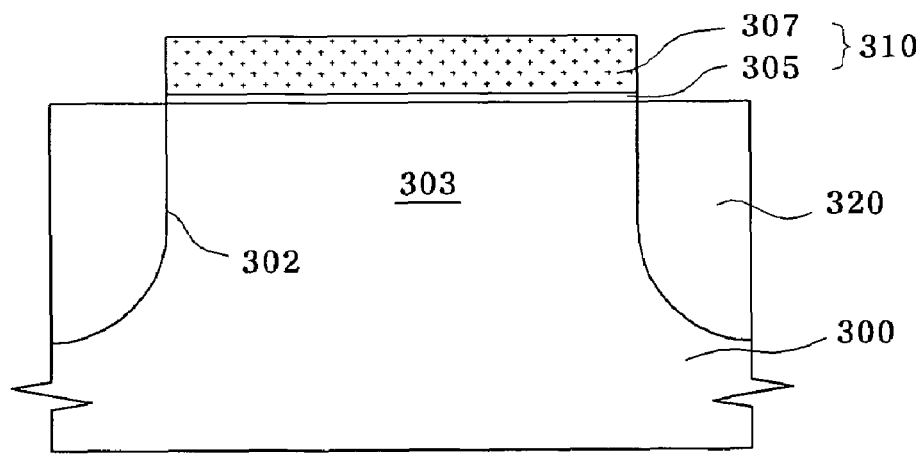
FIGS. 3 through 9 are views illustrating a semiconductor device having step gates in accordance with one embodiment of the present invention and a method of manufacturing the same.

First, referring now to FIG. 3, hard mask film patterns 310 covering an active region 303 are formed on a semiconductor substrate 300. The hard mask film patterns 310 are made of a pad oxide film 305 and a pad nitride film 307 which are sequentially stacked. Then, trenches 302 for isolation of devices are formed by etching the semiconductor substrate 300 to a predetermined depth, using the hard mask film patterns 310 as an etch mask. Next, a burial-type insulating film (not shown) is formed on the hard mask film patterns 310, for example using a high-density plasma oxide film, such that trenches 302 for isolation of devices are buried, and the burial-type insulating film is then subjected to a planarization process, for example chemical mechanical polishing (CMP), so as to expose the upper surface of the hard mask film patterns 310, thereby forming trench isolation films 320.

Figure 4:
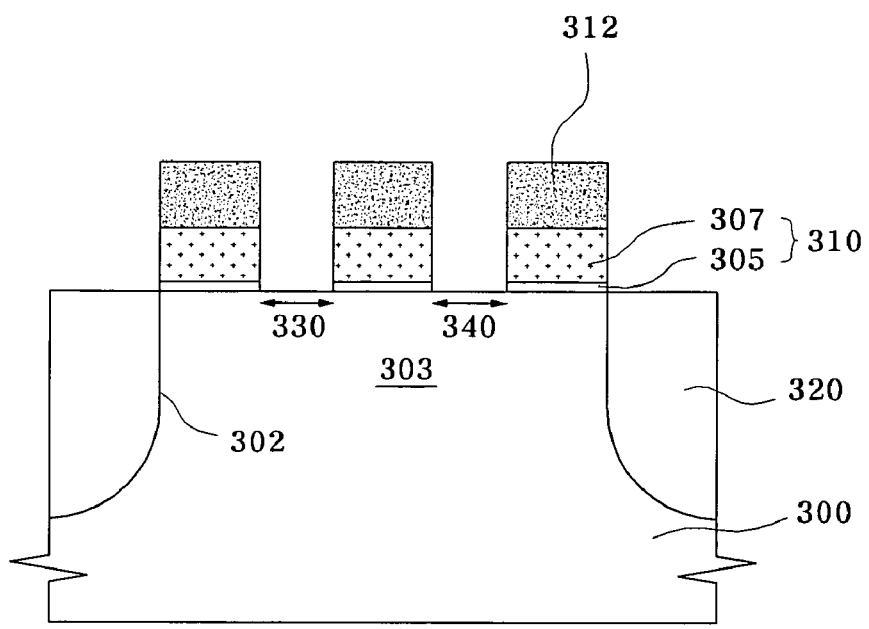

Next, referring to FIG. 4, photoresist film patterns 312 are formed on the hard mask film patterns 310, and the hard mask film patterns 310 are etched using the photoresist film patterns 312 as an etch mask so as to expose a first surface 330 and second surface 340 of an active region 303 in the semiconductor substrate 300. The first surface 330 and second surface 340 are regions in which the selective epitaxial layers having a step will be grown so as to form step gates. The photoresist film patterns 312 for patterning the hard mask film patterns 310, as shown in the layout view of FIG. 2, are formed into stripe shapes passing through both ends and the center of the active region 303.

Figure 5:
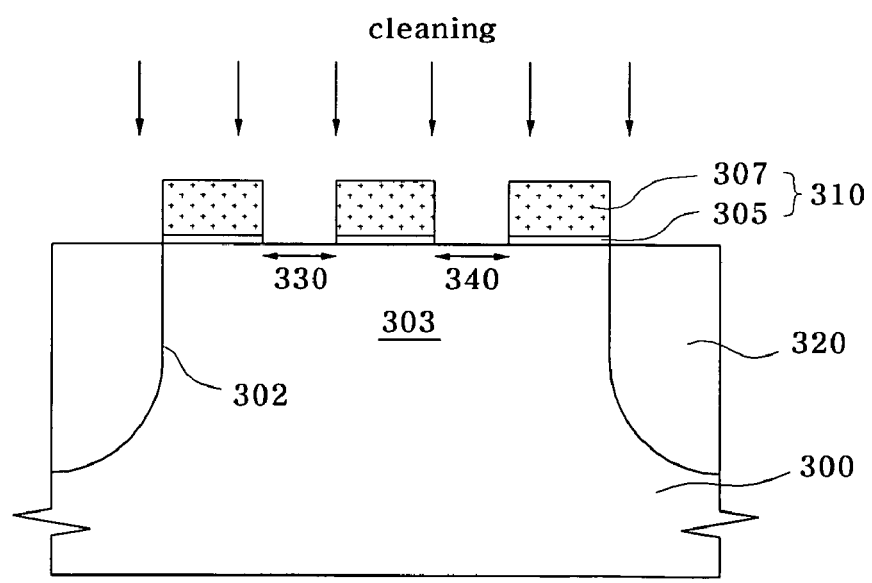

Next, referring to FIG. 5, the photoresist film patterns 312 were removed and the semiconductor substrate 300 was subjected to a cleaning process so as to completely remove oxides present on the exposed first surface 330 and second surface 340. The cleaning process to remove oxides is carried out using a first cleaning solution comprising sulfuric acid ($H_2SO_4$) and hydrogen peroxide ($H_2O_2$) and/or a second cleaning solution comprising hydrofluoric acid (HF) and ammonium fluoride ($NH_4F$). Herein, the first cleaning solution may be a 4:1 mixture of sulfuiric acid and hydrogen peroxide. The second cleaning solution may be a 300:1 mixture of hydrofluoric acid and ammonium fluoride.

Figure 6:
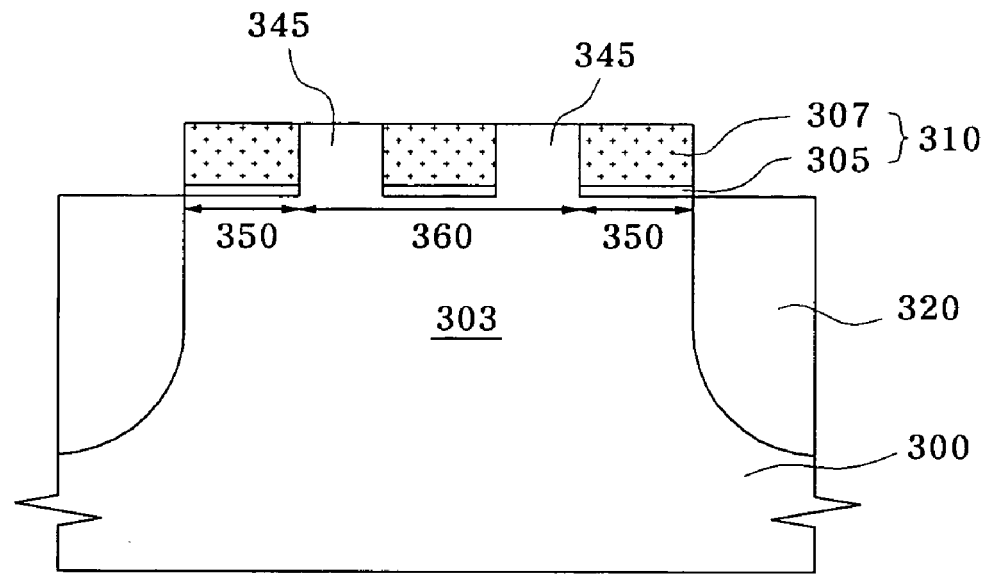

Next, referring to FIG. 6, after performing the cleaning process, selective epitaxial layers 345 are formed on the first surface 330 and second surface 340 exposed due to the hard mask film patterns 310, via use of selective epitaxial growth. The selective epitaxial layers 345 are grown with a supply of dichlorosilane ($SiCl_2H_2$), hydrochloric acid (HCl) and hydrogen ($H_2$) as source gases, at a temperature of about 850° C. and pressure of about 10 to 100 Torr. In this case, the selective epitaxial layers 345 grown at a deposition rate of 600 Å/min has a thickness of 400 Å.

Figure 7:
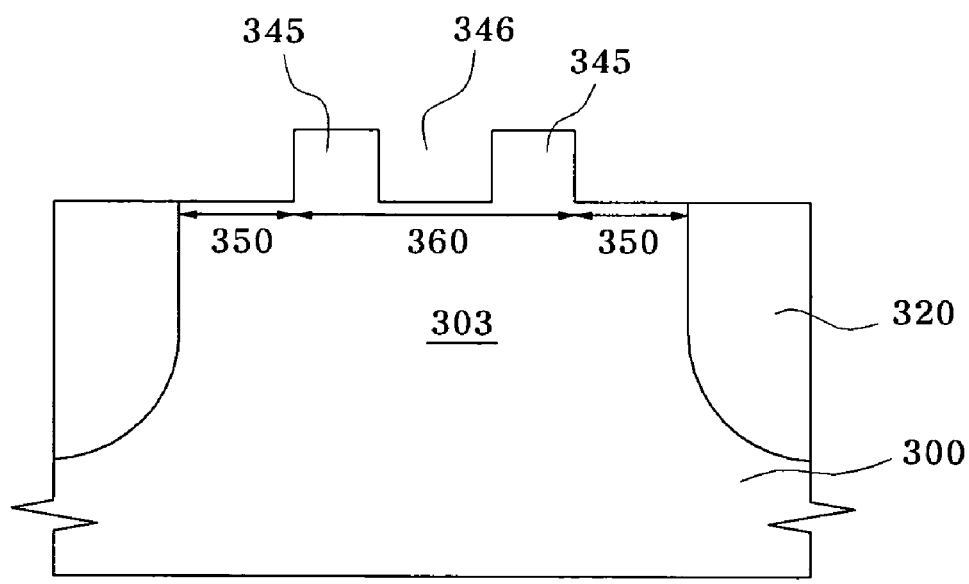

Next, referring to FIG. 7, the hard mask film patterns 310 are removed. Then, first regions 350 having relatively low steps are formed at both ends of the active region 303 adjacent to the trench isolation films 320, and a second region 360 having a relatively high step and including a groove 346 having a predetermined depth is formed at the central part of the active region 303.

Referring to FIG. 8 and FIG. 9, a gate insulating film 301 is formed on the entire surface of the semiconductor substrate 300, utilizing an oxide film, for example, and a gate conductive film (not shown) is formed on the gate insulating film 301. Subsequently, a metal silicide film (not shown) and a insulating capping film (not shown), which constitute gate stacks, are sequentially stacked on the gate conductive film, followed by patterning to form step gate stacks 400 on the boundary between the first region 350 of the semiconductor substrate 300 and the selective epitaxial layer 360 as the second region thereof. The gate conductive film may be formed of a polysilicon film, the metal silicide film may be formed of a tungsten silicide film, and the insulating capping film may be formed of a nitride film.

Next, first impurity regions 410, namely source regions, and a second impurity region 420, namely a drain region, are formed in the semiconductor substrate 300 using the step gate stacks 400 as an ion implantation mask. Even though they are not shown in FIG. 6, after formation of the first impurity regions 410 and second impurity region 420, bottom electrode films, which are electrically connected to the first impurity regions 410, capacitors (not shown) including a dielectric film and top electrode film sequentially formed on the bottom electrode films, and a bit line 430 connected to the second impurity region 420 are formed.

As apparent from the above description, in accordance with the method of manufacturing a semiconductor device having step gates of the present invention, it is possible to form gate stacks having a step-like structure on the boundary between the first regions formed at both ends of the active region adjacent to the trench isolation films and second region consisting of the selective epitaxial layer, without etching a portion of the semiconductor substrate. In addition, a contact area between a bit line and a second impurity region, i.e., a drain region, is increased by provision of a groove formed at the central part of the second region, thus decreasing contact resistance therebetween and therefore the overall signal transfer rate of the device is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device having step gates, the device comprising:
    a semiconductor substrate including first regions having relatively low steps at both ends of an active region defined by trench isolation films, a second region having a relatively high step at a central part of the active region, and a groove having a predetermined depth being formed at a central part of the second region;
    step gate stacks formed on the first regions and the second region, a portion of the step gate stack being located on the first region and another portion of the step gate stack being located on a top surface of the second region while exposing the groove of the second region;
    first impurity regions formed in the first regions exposed by the step gate stacks; and
    a second impurity region formed in the second region exposed by the step gate stacks while enclosing the groove of the second region, wherein the second impurity region is connected with a bit line by the groove while being insulated from the step gate stacks.

2. The semiconductor device according to claim 1, wherein the groove formed at the central part of the second region of the semiconductor substrate has a depth shallower than that of the second impurity region.

3. The semiconductor device according to claim 1, wherein the second region of the semiconductor substrate is a film formed via selective epitaxial growth.

4. The semiconductor device according to claim 1, wherein the first impurity region are connected electrically to bottom electrode films, the semiconductor device further comprising:
    capacitors including a dielectric film and top electrode film sequentially formed on the bottom electrode films; and
    a bit line stack coupled to the second impurity region.

* * * * *